(12) United States Patent
Kim et al.

(10) Patent No.: US 8,872,752 B2
(45) Date of Patent: Oct. 28, 2014

(54) SCAN DRIVER, DISPLAY DEVICE HAVING THE SAME AND METHOD OF DRIVING A DISPLAY DEVICE

(71) Applicants: Sung-Man Kim, Seoul (KR); Bong-Jun Lee, Seoul (KR); Shin-Tack Kang, Yongin-si (KR); Hyeong-Jun Park, Seoul (KR); Yong-Woo Lee, Seoul (KR)

(72) Inventors: Sung-Man Kim, Seoul (KR); Bong-Jun Lee, Seoul (KR); Shin-Tack Kang, Yongin-si (KR); Hyeong-Jun Park, Seoul (KR); Yong-Woo Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/648,505

(22) Filed: Oct. 10, 2012

(65) Prior Publication Data
US 2013/0033417 A1 Feb. 7, 2013

Related U.S. Application Data

(63) Continuation-in-part of application No. 11/488,363, filed on Jul. 18, 2006, now Pat. No. 8,305,324.

(30) Foreign Application Priority Data

Jul. 28, 2005 (KR) .................. 10-2005-0068681

(51) Int. Cl.
*G09G 3/36* (2006.01)

(52) U.S. Cl.
USPC .......................................... 345/100; 345/204

(58) Field of Classification Search
USPC .......................................................... 345/100
See application file for complete search history.

(56) References Cited

U.S. PATENT DOCUMENTS

| | | | |
|---|---|---|---|
| 5,136,622 A | 8/1992 | Plus | |
| 5,315,315 A | 5/1994 | Nakamura | |
| 5,392,058 A * | 2/1995 | Tagawa | 345/104 |
| 5,598,177 A | 1/1997 | Mizukata et al. | |
| 5,648,790 A | 7/1997 | Lee | |
| 5,648,793 A | 7/1997 | Chen | |
| 5,708,454 A | 1/1998 | Katoh et al. | |
| 6,124,840 A | 9/2000 | Kwon | |
| 6,310,594 B1 | 10/2001 | Libsch et al. | |
| 6,417,830 B1 | 7/2002 | Byeon, II | |
| 6,967,639 B2 * | 11/2005 | Kanzaki et al. | 345/100 |
| 7,106,292 B2 | 9/2006 | Moon | |

(Continued)

FOREIGN PATENT DOCUMENTS

| | | |
|---|---|---|
| CN | 1480952 | 3/2004 |
| JP | 2001249643 A | 9/2001 |
| JP | 2001356738 A | 12/2001 |
| JP | 2002-341834 A | 11/2002 |
| JP | 2002341834 A | 11/2002 |
| JP | 2003050568 A | 2/2003 |
| JP | 2003-122319 A | 4/2003 |
| JP | 2003-173167 A | 6/2003 |
| JP | 2005-128153 A | 5/2005 |
| TW | 527501 | 4/2003 |
| TW | 200425045 | 11/2004 |
| TW | I223229 | 11/2004 |

*Primary Examiner* — Grant Sitta
(74) *Attorney, Agent, or Firm* — Cantor Colburn LLP

(57) ABSTRACT

A scan driver drives a display device having a plurality of gate lines transferring scan signals, and a plurality of source lines transferring data signals. The scan driver includes a shift register and a multiple signal applying unit. The shift register includes a plurality of cascade-connected stages, each stage having an output terminal electrically connected to a respective one of the plurality of gate lines. The multiple signal applying unit applies a sub scan signal and a main scan signal. The sub scan signal and the main scan signal sequentially activate each of the plurality of gate lines. Therefore, the scan lines receive the scan signal twice, so that the liquid crystal capacitors electrically connected to the gate lines receive the data voltage twice. As a result, even though the time for charging the liquid crystal capacitors may be reduced, the liquid crystal capacitors may be fully charged to enhance display quality.

9 Claims, 13 Drawing Sheets

(56) References Cited

U.S. PATENT DOCUMENTS

| | | |
|---|---|---|
| 7,145,545 B2 | 12/2006 | Zebedee et al. |
| 7,327,339 B2 | 2/2008 | Akimoto et al. |
| 7,446,760 B2 | 11/2008 | Takada et al. |
| 7,486,268 B2 | 2/2009 | Jang et al. |
| 7,859,507 B2 | 12/2010 | Jang et al. |
| 2003/0058234 A1* | 3/2003 | Kanzaki et al. ............... 345/211 |
| 2003/0227433 A1* | 12/2003 | Moon ........................... 345/100 |
| 2006/0007085 A1 | 1/2006 | Kim et al. |

* cited by examiner

SCAN DRIVER, DISPLAY DEVICE HAVING THE SAME AND METHOD OF DRIVING A DISPLAY DEVICE

CROSS REFERENCE TO RELATED APPLICATIONS

This application is a divisional of U.S. patent application Ser. No. 11/488,363, filed on Jul. 18, 2006, which claims priority to Korean Patent Application No. 2005-68681 filed on Jul. 28, 2005 and all the benefits accruing therefrom under 35 U.S.C. §119, and the contents of which in its entirety are herein incorporated by reference.

BACKGROUND OF THE INVENTION

1. Field of the Invention

The present invention relates to a scan driver, a display device having the scan driver, and a method of driving the display device. More particularly, the present invention relates to a scan driver enhancing display quality of a display device, a display device having the scan driver, and a method of driving the display device.

2. Description of the Related Art

A display device converts electric signals processed by an information process device into an image. Examples of the display device include a liquid crystal display ("LCD") device, an organic light-emitting diode ("OLED") device, a plasma display panel ("PDP"), etc.

The LCD device has many merits, and is therefore used in various fields. The LCD device includes a plurality of gate lines extended along a first direction of an array substrate, a plurality of source lines extended along a second direction of the array substrate that is substantially perpendicular to the first direction, and a plurality of liquid crystal capacitors each electrically connected to one of the gate lines and one of the source lines.

The gate lines are activated in sequence. When one of the gate lines is activated, a data voltage is applied to the liquid crystal capacitors through the source lines, so that the liquid crystal capacitors are electrically charged. When the liquid crystal capacitors are electrically charged, electric fields are generated between a pixel electrode on the array substrate and a common electrode, disposed on an opposite substrate, defining the liquid crystal capacitor. When electric fields are generated between the pixel electrode and the common electrode, an arrangement of liquid crystal molecules of a liquid crystal layer disposed between the pixel electrode and the common electrode is changed. As a result, an optical transmittance of the liquid crystal layer is changed to display an image.

A time period during which first through last gate lines are activated is referred to as one frame.

As a size of the display device increases, and a resolution of the display device is enhanced, a number of gate lines increases. However, one frame is fixed. As a result, a time for activating each gate line decreases.

The data voltage is applied to the liquid crystal capacitor while the gate line is activated. Thus, when the time for activating the gate line decreases, a time for electrically charging the liquid crystal capacitor also decreases, so that a voltage of the liquid crystal capacitor may not arrive at the data voltage. In other words, a charging rate of the liquid crystal capacitor is lowered.

Furthermore, when a driving frequency is raised in order to reduce afterimage effects, the time for electrically charging the liquid crystal capacitor is further reduced.

BRIEF SUMMARY OF THE INVENTION

Exemplary embodiments of the present invention provide a scan driver capable of fully charging the liquid crystal capacitor, even when the time for electrically charging the liquid crystal capacitor is reduced.

Exemplary embodiments of the present invention also provide a display device having the scan driver.

Exemplary embodiments of the present invention also provide a method of driving a display device, which is capable of fully charging the liquid crystal capacitor, even when the time for electrically charging the liquid crystal capacitor is reduced.

In an exemplary scan driver according to exemplary embodiments of the present invention, the scan driver drives a display device having a plurality of gate lines transferring scan signals and a plurality of source lines transferring data signals. The scan driver includes a shift register and a multiple signal applying unit. The shift register includes a plurality of cascade-connected stages, each stage having an output terminal electrically connected to a respective one of the plurality of gate lines. The multiple signal applying unit applies a sub scan signal and a main scan signal. The sub scan signal and the main scan signal sequentially activate each of the plurality of gate lines.

Preferably, each of the sub scan signal and the main scan signal has a pulse width of H, and a time period between a rising edge of the sub scan signal and a rising edge of the main scan signal is 'H×I', wherein 'I' represents a natural number greater than one.

Preferably, 'I' is a least common multiple of a polarity period of a data voltage applied to each of the gate lines along the source lines, and a clock number for driving the shift register. For example, a value of 'I' is one of two, three and four.

For example, the multiple signal applying unit includes a starting part and an ending part. Each of the starting part and the ending part includes 'I' number of stages. A last stage of the starting part is cascade-connected to a first stage of the shift register, and a last stage of the shift register is cascade-connected to a first stage of the ending part. A scan start signal for driving the shift register is simultaneously applied to both of a first stage of the starting part and the first stage of the shift register.

Preferably, the scan driver may further include a diode formed on a line through which the scan start signal is applied to the first stage of the shift register in order to prevent a carry signal outputted from the last stage of the starting part from being applied to the first stage of the starting part.

For example, the multiple signal applying unit comprises 'I' number of cascaded connected stages. A last stage of the shift register is cascade-connected to a first stage of the multiple signal applying unit. A scan start signal for driving the shift register includes a sub scan signal and a main scan signal. The main scan signal is applied to a first transistor of the shift register after the sub scan signal is applied to the first transistor of the shift register.

Preferably, each of the sub scan signal and the main scan signal has a pulse width of H, and a time period between a rising edge of the sub scan signal and a rising edge of the main scan signal is 'H×I', wherein 'I' represents a natural number greater than one.

Preferably, 'I' is a least common multiple of a polarity period of a data voltage applied to each of the gate lines along the source lines, and a clock number for driving the shift register. For example, a value of 'I' is one of two, three and four.

In an exemplary display device according to exemplary embodiments of the present invention, the display device includes a liquid crystal display ("LCD") panel and a scan driver. The LCD panel includes a plurality of gate lines transferring scan signals, and a plurality of source lines transferring data signals. The scan driver includes a shift register including a plurality of cascade-connected stages, each stage having an output terminal electrically connected to a respective one of the plurality of gate lines. A scan start signal for driving the shift register comprises a sub scan signal and a main scan signal, the main scan signal applied to a first transistor of the shift register after the sub scan signal is applied to the first transistor of the shift register. A liquid crystal capacitor of the display device receives a first data signal at a first time when the sub scan signal is applied and receives a second data signal at a second time when the main scan signal is applied.

In another exemplary display device according to exemplary embodiments of the present invention, the display device includes an LCD panel and a scan driver. The LCD panel includes a plurality of gate lines transferring scan signals, and a plurality of source lines transferring data signals. The scan driver includes a shift register and a multiple signal applying unit. The shift register includes a plurality of cascade-connected stages, each stage having an output terminal electrically connected to a respective one of the plurality of gate lines. The multiple signal applying unit applies a sub scan signal and a main scan signal. The sub scan signal and the main scan signal sequentially activate each of the plurality of gate lines.

In an exemplary method of driving an exemplary display device, an N-th gate line and an (N+I)-th gate line are simultaneously activated. Then, data voltages are applied to liquid crystal capacitors electrically connected to the N-th gate line and the (N+I)-th gate line.

Preferably, the data voltage applied to the liquid crystal capacitors electrically connected to the N-th gate line and the (N+I)-th gate line corresponds to liquid crystal capacitors electrically connected to the N-th gate line.

Preferably, 'I' is a least common multiple of a polarity period of a data voltage applied to each of the gate lines along the source lines, and a clock number for driving the shift register. For example, a value of 'I' is one of two, three and four.

According to exemplary embodiments of the present invention, the scan lines receive the scan signal twice, so that the liquid crystal capacitors electrically connected to the gate lines receive the data voltage twice. Therefore, even though the time for charging the liquid crystal capacitors may be reduced, the liquid crystal capacitors may be fully charged to enhance display quality.

BRIEF DESCRIPTION OF THE DRAWINGS

The above and other features and advantages of the present invention will become more apparent by describing in detailed exemplary embodiments thereof with reference to the accompanying drawings, in which.

DETAILED DESCRIPTION OF THE INVENTION

Figure 1:
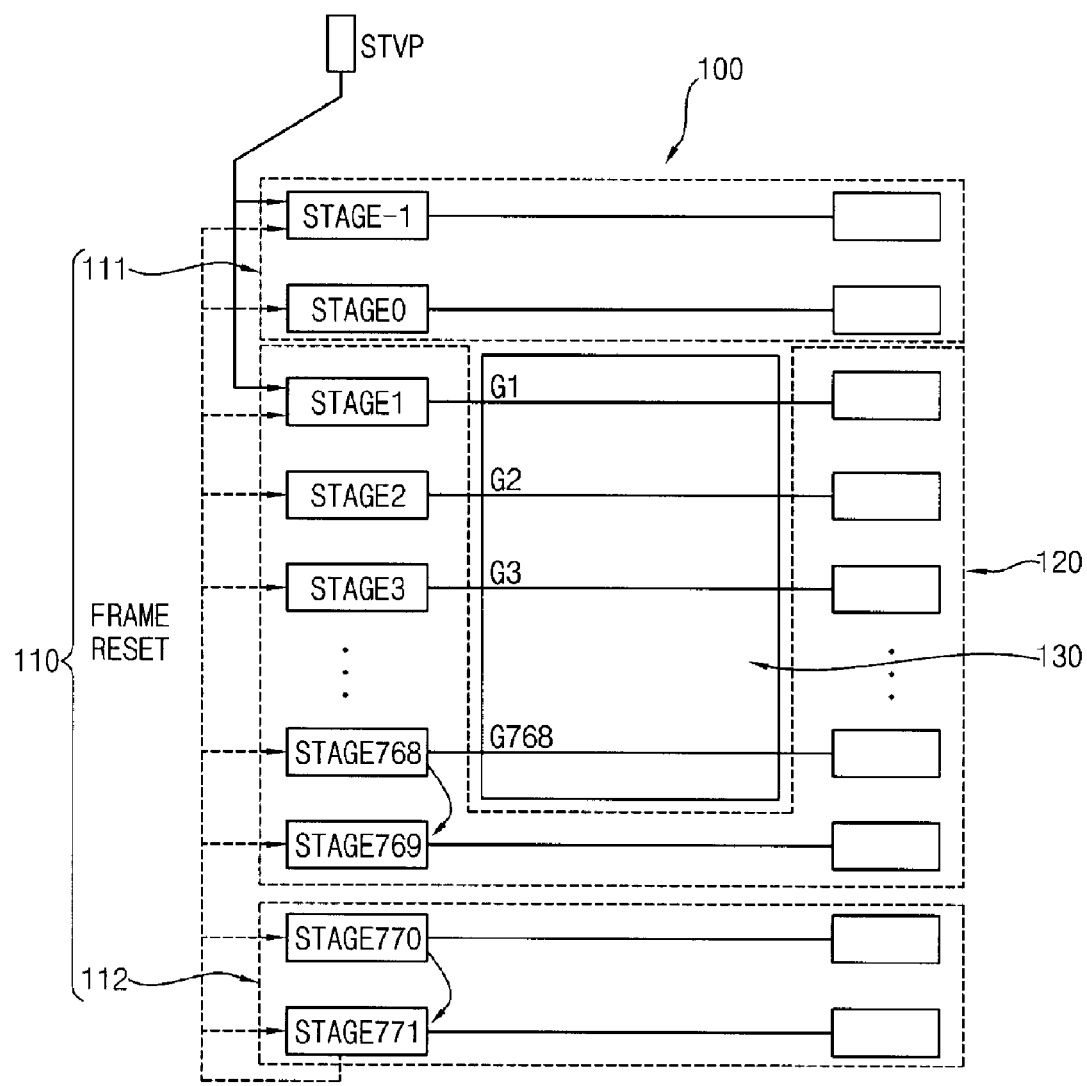
FIG. 1 is a block diagram illustrating an exemplary display device having an exemplary scan driver according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an exemplary display device having an exemplary scan driver according to an exemplary embodiment of the present invention.

Referring to FIG. 1, a display device 100 according to an exemplary embodiment of the present invention includes a multiple signal applying unit 110, a shift register 120, and a liquid crystal display ("LCD") panel 130.

The multiple signal applying unit 110 includes a starting part 111 and an ending part 112. The starting part 111 and the ending part 112 each include a plurality of stages. The multiple signal applying unit 110 is electrically connected to the shift register 120.

The shift register 120 includes, for example, 769 stages STAGE1, STAGE2, . . . , STAGE769 electrically connected in series, such as cascade-connected. The starting part 111 of the multiple signal applying unit 110 includes, for example, two stages STAGE-1 and STAGE0 electrically connected in series. The last stage STAGE0 of the starting part 111 is electrically connected to the first stage STAGE1 of the shift register 120. The ending part 112 includes, for example, two stages STAGE770 and STAGE771 electrically connected in series. The first stage STAGE770 of the ending part 112 is electrically connected to the last stage STAGE769 of the shift register 120.

A number of the stages in the starting part 111 and the ending part 112 has a relationship with a driving method such as a dot inversion, a column inversion, 2×1 inversion, etc., and a clock number for driving the stages. A number of the stages included in the starting part 111 and the ending part 112 is equal to a least common multiple of a polarity period of a data voltage (with respect to a reference voltage) applied to each of the gate lines G1, G2, . . . Gm along a source line, and a clock number for driving the shift register 120, as will be further described below.

In the illustrated embodiment of FIG. 1, the starting part 111 and the ending part 112 of the multiple signal applying unit 110 each include two stages, respectively.

A scan start signal STVP for driving the shift register 120 is applied to both of the first stage STAGE1 of the shift register 120 and the first stage STAGE-1 of the starting part 111 of the multiple signal applying unit 110.

Figure 2:
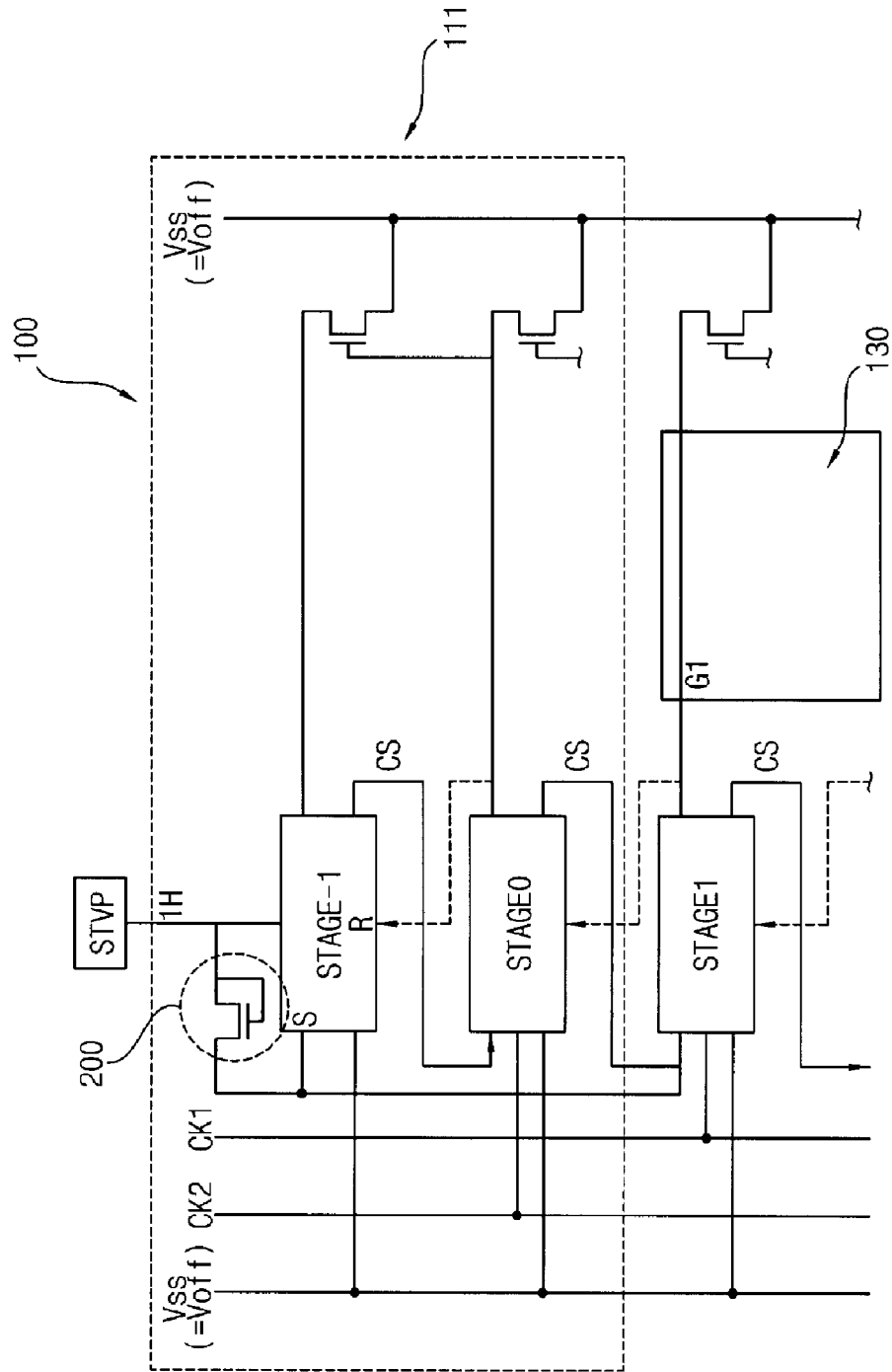
FIG. 2 is a block diagram illustrating an exemplary starting part of an exemplary multiple signal applying unit of the exemplary scan driver in FIG. 1.

FIG. 2 is a block diagram illustrating an exemplary starting part of an exemplary multiple signal applying unit of the exemplary scan driver in FIG. 1.

Referring to FIGS. 1 and 2, the starting part 111 of the multiple signal applying unit 110 includes, for example, two stages, STAGE-1 and STAGE0. An output signal of the starting part 111 is not applied to the LCD panel 130.

When the scan start signal STVP is applied to the first stage STAGE-1 of the starting part 111, the first stage STAGE-1 of the starting part 111 outputs a carry signal CS.

The carry signal CS outputted from the first stage STAGE-1 of the starting part 111 is applied to the second stage STAGE0 of the starting part 111 to drive the second stage STAGE0 of the starting part 111. Then, the second stage STAGE0 outputs a carry signal CS. The carry signal CS outputted from the second stage STAGE0 is applied to the first stage STAGE1 of the shift register 120 to output a main scan signal. The main scan signal activates the first gate line G1 of the LCD panel 130. The carry signal CS outputted from the first stage STAGE1 is applied to the second stage STAGE2 of the shift register 120 to output a main scan signal that is applied to the second gate line G2 of the LCD panel 130.

The scan start signal STVP applied to the first stage STAGE-1 of the starting part 111 is also applied to the first stage STAGE1 of the shift register 120, so that the first stage STAGE1 of the shift register 120 outputs a sub scan signal. The scan start signal STVP may be substantially simultaneously applied to the first stage STAGE-1 of the starting part 111 and the first stage STAGE1 of the shift register 120. The sub scan signal activates the first gate line G1 of the LCD panel 130.

The first gate line G1 is firstly activated by the sub scan signal output from the first stage STAGE1 of the shift register 120 in response to the scan start signal STVP applied to the first stage STAGE1 of the shift register 120, and then secondly activated by the main scan signal output from the first stage STAGE1 of the shift register 120 in response to the carry signal CS outputted from the second stage STAGE0 and applied to the first stage STAGE1 of the shift register 120. Therefore, the time for activating the gate lines increases, so that the liquid crystal capacitors electrically connected to the gate lines in the LCD panel 130 may be fully charged.

The starting part 111 further includes a diode 200. The diode 200 is formed on a line through which the scan start signal STVP is applied to the first stage STAGE1 of the shift register 120 in order to prevent the carry signal CS outputted from the second stage STAGE0 of the starting part 111 from being applied to the first stage STAGE-1 of the starting part 111. For example, the diode 200 may be formed through electrically connecting a gate electrode to a drain electrode of a thin-film transistor.

Figure 3:
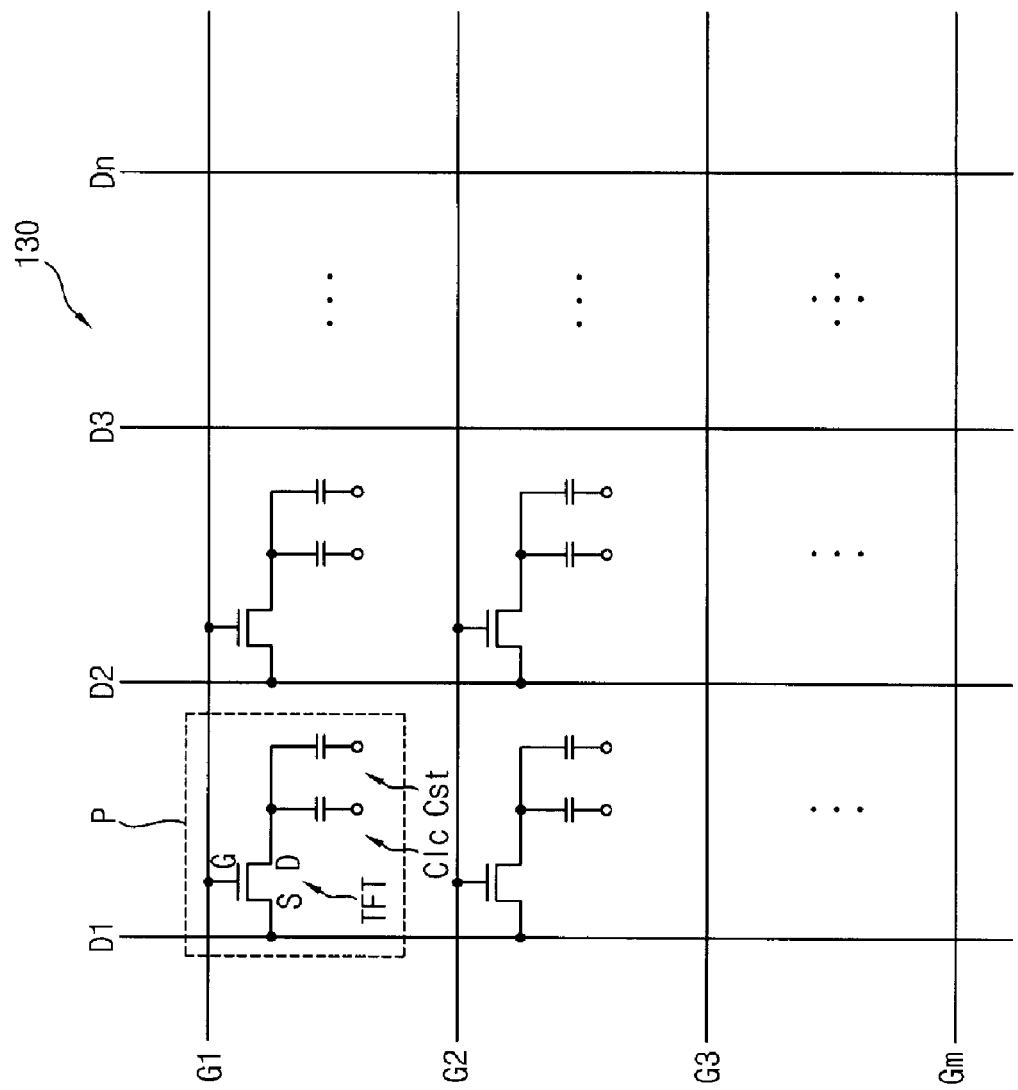
FIG. 3 is a block diagram illustrating an exemplary liquid crystal display ("LCD") panel in FIG. 1.

FIG. 3 is a block diagram illustrating an exemplary LCD panel in FIG. 1.

Referring to FIG. 3, an LCD panel 130 includes a plurality of gate lines G1, G2, . . . , Gm, a plurality of source lines D1, D2, . . . , Dn, and a plurality of pixels P arranged in a matrix, each pixel P formed in a region defined by two adjacent gate lines and two adjacent source lines.

Each of the pixels P includes a switching element TFT such as a thin film transistor, a liquid crystal capacitor Clc, and a storage capacitor Cst. The switching element TFT includes a gate electrode G, a source electrode S, and a drain electrode D. The gate electrode G is electrically connected to one of the gate lines G1, G2, . . . , Gm. The source electrode S is electrically connected to one of the source lines D1, D2, . . . , Dn. The drain electrode is electrically connected to a pixel electrode of the liquid crystal capacitor Clc.

The liquid crystal capacitor Clc includes the pixel electrode, a common electrode, and a liquid crystal layer disposed between the pixel electrode and the common electrode. In one exemplary embodiment, the pixel electrode may be formed on the array substrate with the gate lines and the source lines, and the common electrode may be formed on an opposite substrate facing the array substrate, with the liquid crystal layer disposed between the array substrate and the opposite substrate. When the scan signal is applied to the gate lines, the switching elements TFTs electrically connected to the gate lines are turned on, and a data voltage is applied to the pixel electrode through the source electrode S and the drain electrode D of the TFTs that are turned on.

When the data voltage is applied to the pixel electrode, electric fields are formed between the pixel electrode and the common electrode. The electric fields rearrange liquid crystal molecules of the liquid crystal layer to change an optical transmittance. As a result, an image is displayed.

The storage capacitor Cst is electrically connected to the liquid crystal capacitor Clc in parallel, so that the storage capacitor Cst maintains the data voltage applied to the liquid crystal capacitor Clc during one frame.

Hereinafter, output signals of the stages will be explained by time periods.

Figure 4:
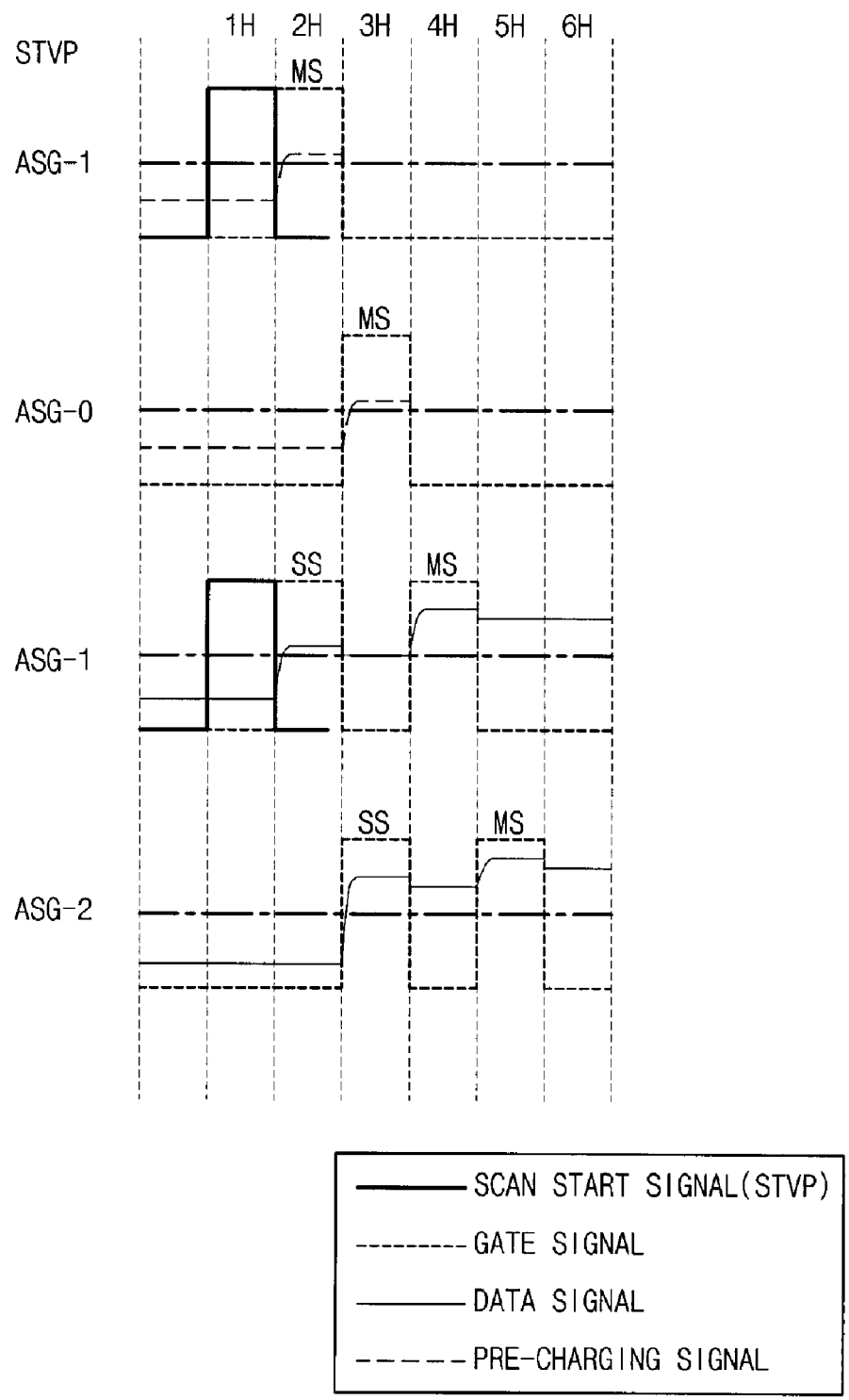
FIG. 4 is a timing diagram illustrating input and output signals of the exemplary scan driver in FIG. 1.

FIG. 4 is a timing diagram illustrating input and output signals of the exemplary scan driver in FIG. 1. Hereinafter, an operation of the exemplary scan driver will be described with reference to FIGS. 1, 3 and 4.

1 H Time Period

During a 1 H time period, the scan start signal STVP is simultaneously applied to both the first stage STAGE-1 of the starting part 111 of the multiple signal applying unit 110 and the first stage STAGE1 of the shift register 120. The scan start signal STVP applied to the first stage STAGE-1 of the starting part 111 of the multiple signal applying unit 110 will induce a main scan signal MS, and the scan start signal STVP applied to the first stage STAGE1 of the shift register 120 will induce a sub scan signal SS.

2 H Time Period

During the 2 H time period, the first stage STAGE-1 of the starting part 111 outputs the main scan signal MS in response to the scan start signal STVP, and the first stage STAGE1 of the shift register 120 outputs the sub scan signal SS in response to the scan start signal STVP.

The main scan signal MS outputted from the first stage STAGE-1 of the starting part 111 is applied to the second stage STAGE0 of the starting part 111. The sub scan signal SS outputted from the first stage STAGE1 of the shift register 120 is applied to both the second stage STAGE2 of the shift register 120 and the first gate line G1 of the LCD panel 130 to activate the first gate line G1.

When the first gate line G1 of the LCD panel 130 is activated, the data signal is applied to the liquid crystal capacitors Clc through the source lines D1, D2, . . . , Dn. The data signal only pre-charges the liquid crystal capacitors Clc. In other words, the data signal does not correspond to a real image.

For example, the data signal has an opposite polarity to that of a previous frame, with respect to a reference voltage Vcom.

3 H Time Period

During the 3 H time period, the second stage STAGE0 of the starting part 111 outputs the main scan signal MS in response to the main scan signal MS outputted from the first stage STAGE-1 of the starting part 111, and the second stage STAGE2 of the shift register 120 outputs the sub scan signal SS in response to the sub scan signal SS outputted from the first stage STAGE1 of the shift register 120.

The main scan signal MS outputted from the second stage STAGE0 of the starting part 111 is applied to the first stage STAGE1 of the shift register 120. The sub scan signal SS outputted from the second stage STAGE2 of the shift register 120 is applied to both the third stage STAGE3 of the shift register 120 and the second gate line G2 of the LCD panel 130 to activate the second gate line G2.

When the second gate line G2 of the LCD panel 130 is activated, the data signal is applied to the liquid crystal capacitors Clc through the source lines D1, D2, . . . , Dn. The data signal only pre-charges the liquid crystal capacitors Clc. In other words, the data signal does not correspond to a real image.

For example, the data signal has an opposite polarity to that of a previous frame, with respect to a reference voltage Vcom.

4 H Time Period

During the 4 H time period, the first stage STAGE1 of the shift register 120 outputs the main scan signal MS in response to the main scan signal MS outputted from the second stage STAGE0 of the starting part 111, and the third stage STAGE3 of the shift register 120 outputs the sub scan signal SS in response to the sub scan signal SS outputted from the second stage STAGE2 of the shift register 120.

The main scan signal MS outputted from the first stage STAGE1 of the shift register 120 is applied to the second stage STAGE2 of the shift register 120, and activates the first gate line G1 of the LCD panel 130. The sub scan signal SS outputted from the third stage STAGE3 of the shift register 120 is applied to both the fourth stage STAGE4 of the shift register 120 and the third gate line G3 of the LCD panel 130 to activate the third gate line G3.

When the first gate line G1 is activated, the data signal is applied to the liquid crystal capacitor Clc electrically connected to the first gate line G1 through the source lines D1, D2, . . . , Dn. The data signal electrically charges the liquid crystal capacitors Clc, so that the data signal corresponding to a first line of an image pixel is applied to the liquid crystal capacitors Clc that are electrically connected to the first gate line G1. The liquid crystal capacitors Clc that are electrically connected to the first gate line G1 were pre-charged during the 2 H time period, so that the liquid crystal capacitors Clc that are electrically connected to the first gate line G1 may be fully charged during the 4 H time period.

When the third gate line G3 of the LCD panel 130 is activated, the data signal corresponding to a first line of an image pixel is applied to the liquid crystal capacitors Clc through the source lines D1, D2, . . . , Dn. As this time period, the data signal only pre-charges the liquid crystal capacitors Clc. In other words, the data signal does not correspond to a real image corresponding to the third gate lines G3.

For example, the data signal has an opposite polarity to that of a previous frame, with respect to a reference voltage Vcom.

The liquid crystal capacitors Clc electrically connected to the third gate line G3 are pre-charged through the data voltage corresponding to the first gate line G1, and fully charged through the data voltage corresponding to the third gate line G3 during the 6 H time period.

Even though the liquid crystal capacitors Clc electrically connected to the third gate line G3 are pre-charged through the data voltage corresponding to the first gate line G1, the data voltage corresponding to the first gate line G1 is not perceived by a user, because the 1 H time period is too short. In particular, the 1 H time period may be about 13.3 μs.

However, the liquid crystal capacitors Clc corresponding to the first gate line G1, which are fully charged by the data voltage corresponding to the first line of image, maintain the data voltage during one frame, so that an image displayed on the display device 100 is not distorted.

Operations after the 4 H time period are repeated. Therefore, any further explanation will be omitted.

As described above, the data voltage for pre-charging and the data voltage for charging are applied to liquid crystal capacitors Clc, so that the liquid crystal capacitors Clc are fully charged even when the 1 H time period is reduced.

Recently, an LCD device employs a dot inversion method, a column inversion method, a 2×1 inversion method, etc. as a driving method thereof in order to reduce a gradual failure of the liquid crystal. According to the dot inversion method, the column inversion method, the 2×1 inversion method, etc., a data voltage having an opposite polarity with respect to a reference voltage is applied to the liquid crystal capacitors Clc. Therefore, when the liquid crystal capacitors Clc are pre-charged, and then mainly charged, the liquid crystal capacitors Clc are ready for inversion during being pre-charged. Therefore, according to the LCD device employing the dot inversion method, the column inversion method, the 2×1 inversion method, etc., the effectiveness of the present invention may be more enhanced.

Figure 5:
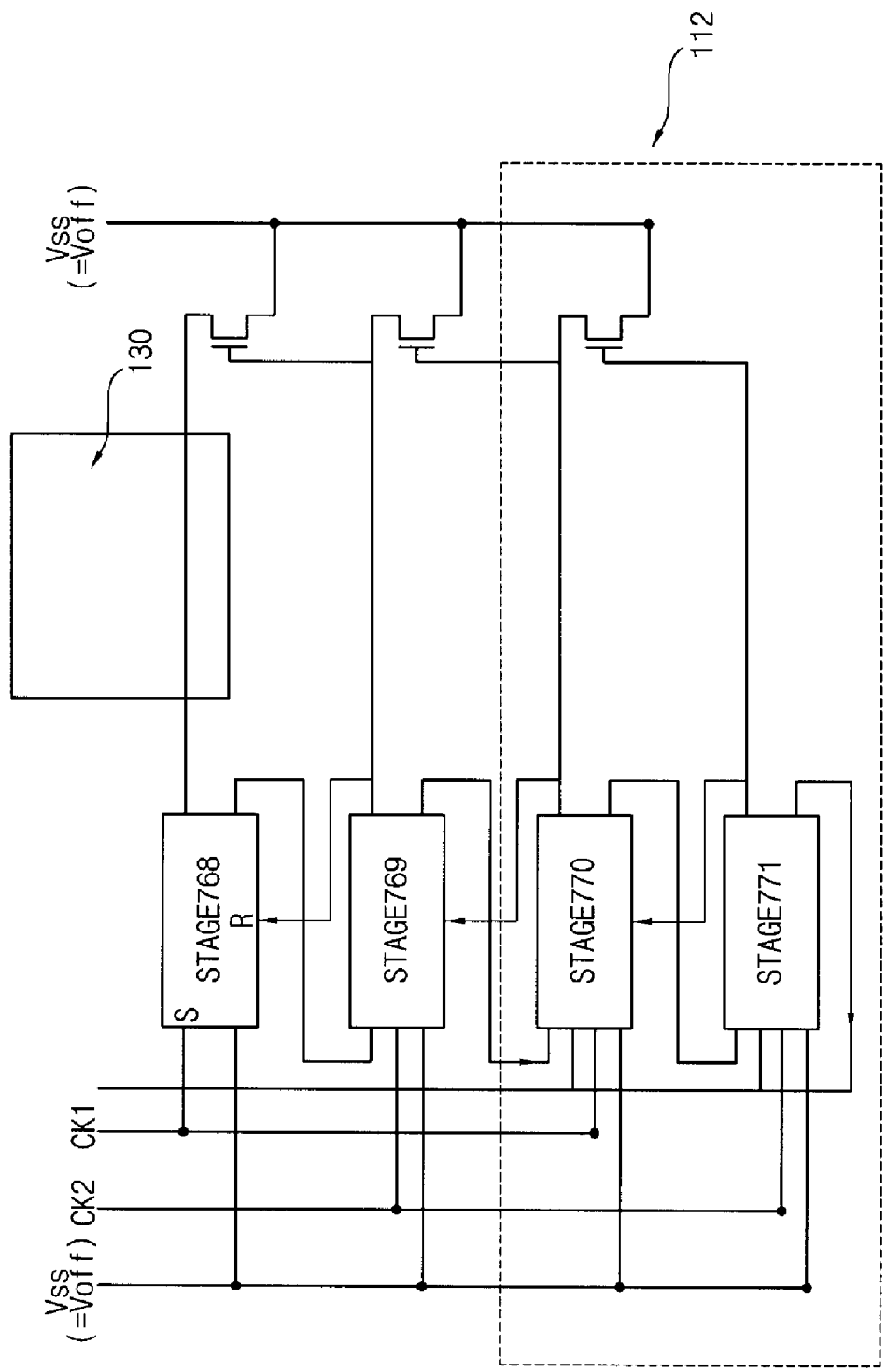
FIG. 5 is a block diagram illustrating an exemplary ending part of an exemplary multiple signal applying unit of the exemplary scan driver in FIG. 1.

FIG. 5 is a block diagram illustrating an exemplary ending part of an exemplary multiple signal applying unit of the exemplary scan driver in FIG. 1.

Referring to FIGS. 1 and 5, the ending part 112 of the multiple signal applying unit 110 includes, for example, two stages STAGE770 and STAGE771. The ending part 112 includes the same number of stages as the starting part 111. The number of stages in the starting part 111 and the ending part 112 relates to a driving method such as a dot inversion, a column inversion, 2×1 inversion, etc., and a clock number for driving the stages, as will be further described below.

When the sub scan signal SS (or carry signal CS) is applied to the last stage STAGE769 of the shift register 120, a frame-reset circuit (not shown) is operated to terminate the present frame. Therefore, the main scan signal MS is not applied to the second to last stage STAGE768 and the last stage STAGE769. In order to solve the above-mentioned problem, the ending part 112 including two stages STAGE770 and STAGE771 is formed, and the frame-reset circuit (not shown) is connected to the last STAGE771 of the ending part 112.

Figure 6:
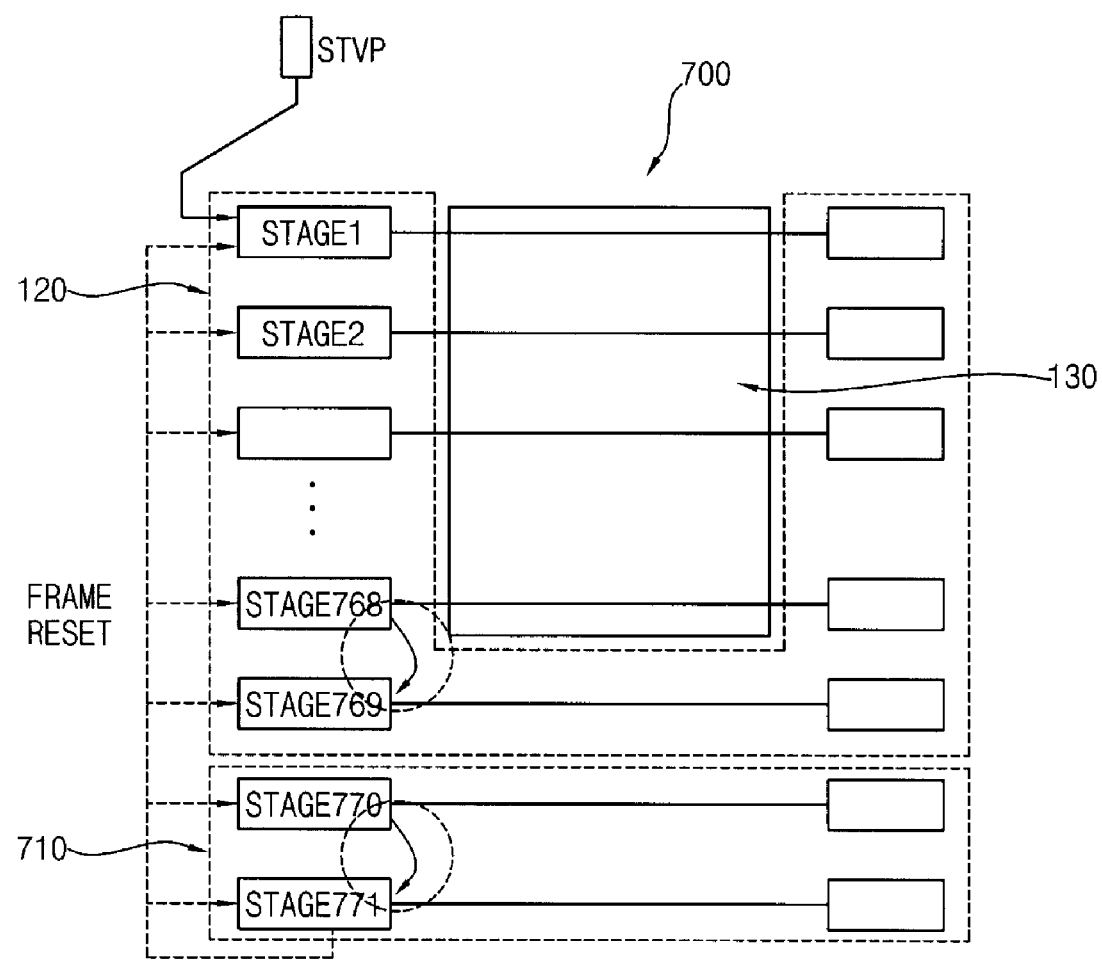
FIG. 6 is a block diagram illustrating an exemplary display device having an exemplary scan driver according to another exemplary embodiment of the present invention.

FIG. 6 is a block diagram illustrating an exemplary display device having an exemplary scan driver according to another exemplary embodiment of the present invention. The display device of the exemplary embodiment of FIG. 6 is substantially the same as that in FIG. 1 except for a multiple signal applying unit. Thus, the same reference numerals will be used to refer to the same or like parts as those described in FIG. 1 and any further explanation concerning the above elements will be omitted.

Referring to FIG. 6, a display device 700 according to another exemplary embodiment of the present invention includes a multiple signal applying unit 710, a shift register 120, and an LCD panel 130.

The multiple signal applying unit 710 includes a plurality of stages electrically connected in series. In particular, the stages are cascade-connected. The multiple signal applying unit 710 is electrically connected to the shift register 120.

In particular, the shift register 120 includes, for example, 769 stages STAGE1, STAGE2, . . . , STAGE769 cascade-connected. The multiple signal applying unit 710 includes two stages STAGE770 and STAGE771. The first stage STAGE770 of the multiple signal applying unit 710 is electrically connected to the last stage STAGE769 of the shift register 120.

A number of the stages in the multiple signal applying unit 710 is related to a driving method such as dot inversion, column inversion, 2×1 inversion, etc., and a clock number for driving the stages.

The scan start signal STVP for driving the shift register 120 includes a sub scan signal SSS and a main scan signal MSS. The sub scan signal SSS is firstly applied to the first stage STAGE1 of the shift register 120, and the main scan signal MSS is applied to the first stage STAGE1 of the shift register 120 after a specific time has passed. When a pulse width of the sub scan signal SSS and the main scan signal MSS is 'H', a time period between a rising edge of the sub scan signal SSS and a rising edge of the main scan signal MSS is expressed as 'l×H', wherein 'l' is a least common multiple of a polarity period of a data voltage (with respect to a reference voltage) applied to each of the gate lines G1, G2, . . . Gm along a source line, and a clock number for driving the shift register 120, as will be further described below.

According to the present embodiment, a number of stages is reduced in comparison with the scan driver in FIG. 1, because the starting part 111 is not included in this embodiment, so that a size of the scan driver is reduced. Additionally, a possibility of error, which may occur to the stages, is reduced to enhance productivity.

Figure 7:
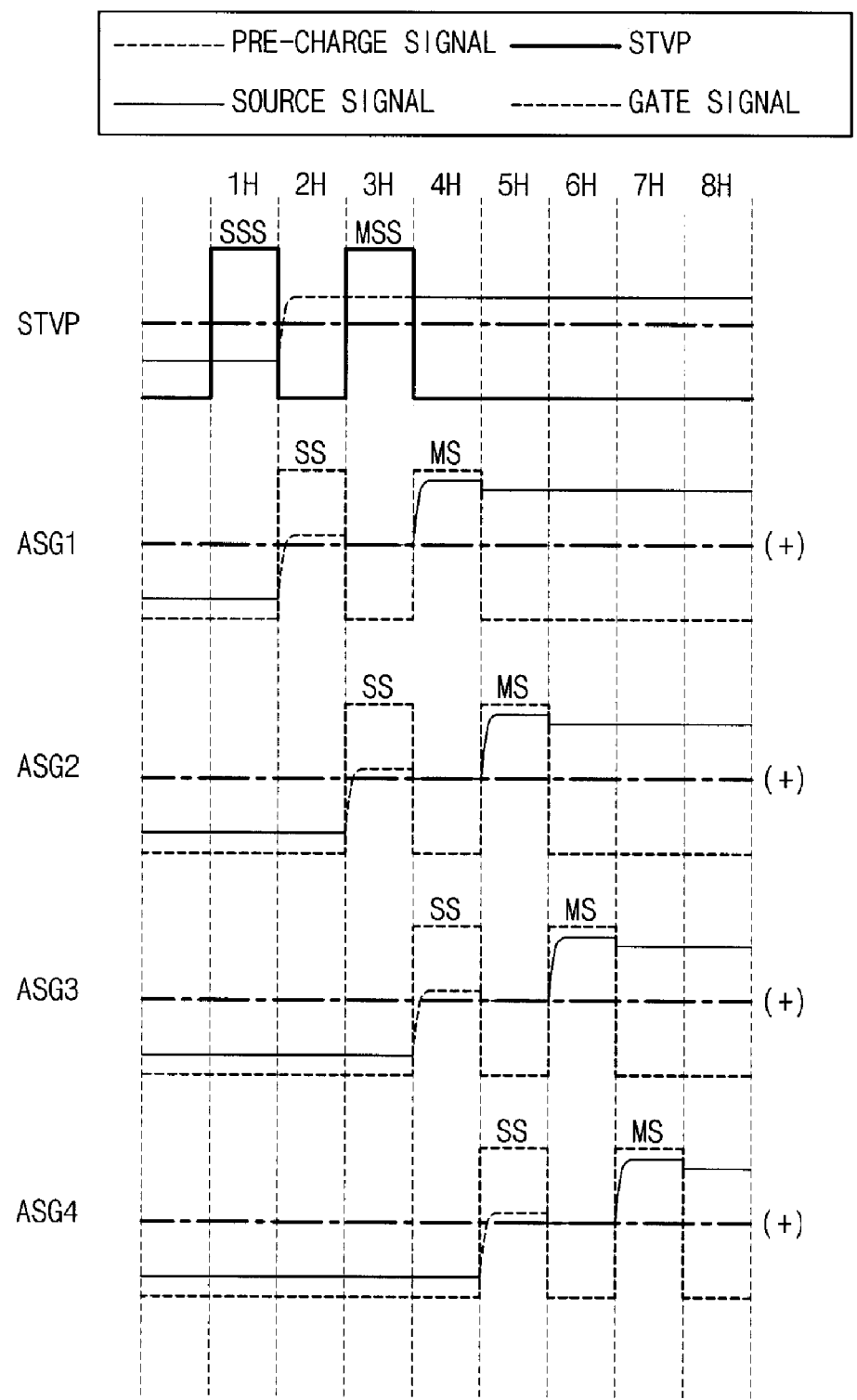
FIG. 7 is a timing diagram illustrating input and output signals of the exemplary scan driver in FIG. 6 according to a column inversion driving method.

FIG. 7 is a timing diagram illustrating input and output signals of the exemplary scan driver in FIG. 6 according to a column inversion driving method. The method of driving the exemplary display device in FIG. 6, which is described in FIG. 7, may also be employed by the exemplary display device in FIG. 1.

According to the column inversion method, data voltages having the same polarity with respect to a reference voltage are applied to the liquid crystal capacitors Clc electrically connected to the same source lines, and data voltages having an opposite polarity with respect to the reference voltage are applied to liquid crystal capacitors electrically connected to adjacent source lines. In particular, data voltages having a positive polarity with respect to a reference voltage are applied to liquid crystal capacitors Clc that are electrically connected to, for example, odd-numbered source lines D1, D3, . . . , and data voltages having a negative polarity with respect to a reference voltage are applied to liquid crystal capacitors Clc that are electrically connected to, for example, even-numbered source lines D2, D4, . . . , or vice versa. Additionally, a polarity of the data voltage applied to each liquid crystal capacitor Clc in an n-th frame is opposite to a polarity of the data voltage applied to each liquid crystal capacitor Clc in an (n−1)-th frame.

According to the column inversion method, a polarity period of the data voltage is 1 H, because the polarity of the data voltage corresponding to each of the gate lines G1, G2, . . . , Gm is the same, and a clock signal for driving the shift register 120 is two (CK1 and CK2 in FIG. 2). Therefore, a least common multiple is 2.

According to the column inversion, the scan driver in FIGS. 1 to 5 includes the starting part 111 having two stages STAGE-1 and STAGE0, and the ending part 112 having two stages STAGE770 and STAGE771. The scan driver in FIG. 6 includes two stages STAGE770 and STAGE771. As a result, a time period between the rising edge of the sub scan signal SSS and the rising edge of the main scan signal MSS is 2 H.

According to the present embodiment, the sub scan signal SSS and the main scan signal MSS of the scan start signal STVP sequentially activate gate lines instead of the starting part 111 in FIGS. 1 and 2. In other words, an operation of the stages in the shift register 120 is substantially the same as that in FIGS. 1 to 6. Therefore, a detailed explanation of 1 H to 4 H time period will be omitted.

Figure 8:
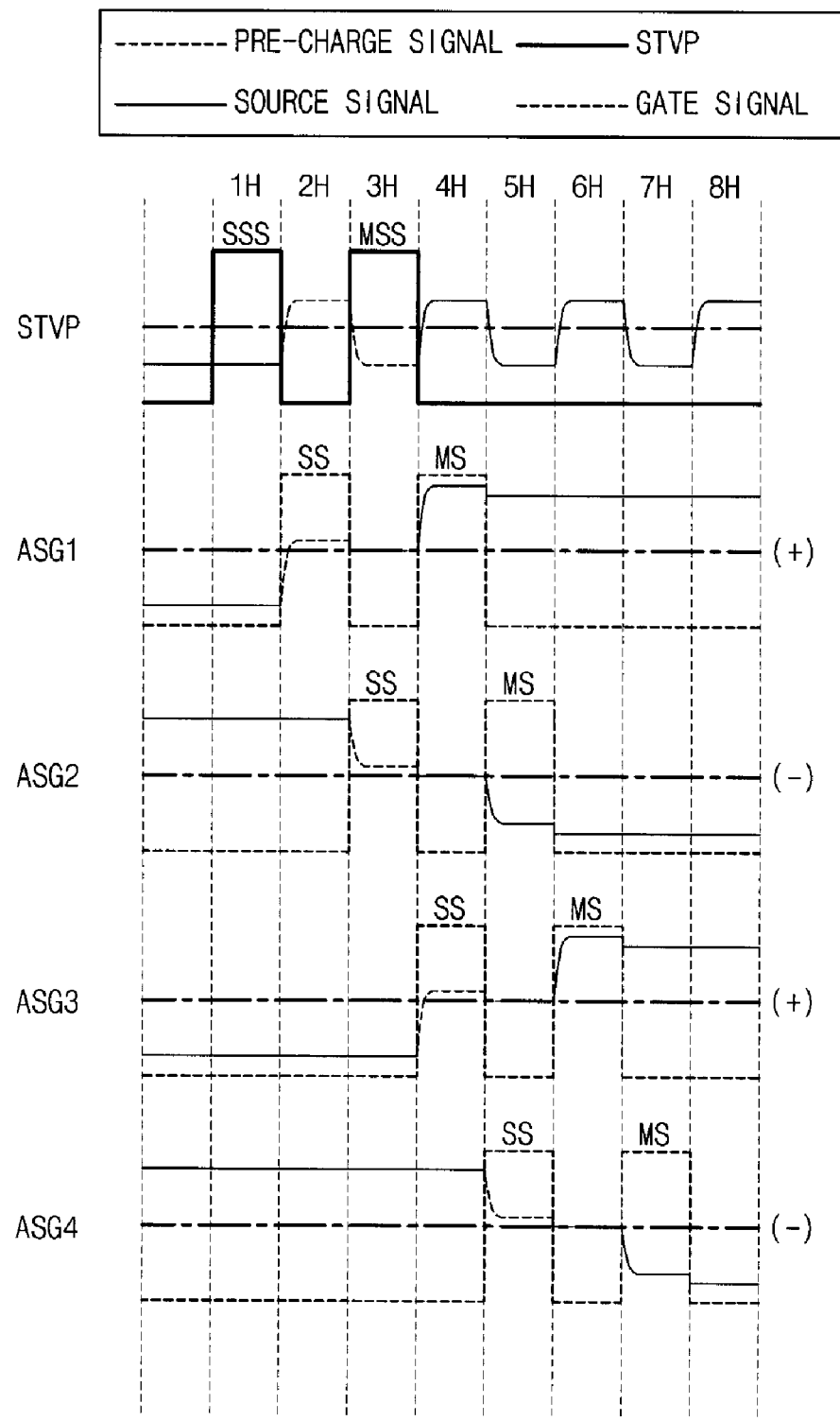
FIG. 8 is a timing diagram illustrating input and output signals of the exemplary scan driver in FIG. 6 according to a dot inversion driving method.

FIG. 8 is a timing diagram illustrating input and output signals of the exemplary scan driver in FIG. 6 according to a dot inversion driving method. The exemplary method of driving the exemplary display device in FIG. 6, which is described in FIG. 8, may also be employed by the exemplary display device in FIG. 1.

According to the dot inversion method, data voltages having an opposite polarity with respect to a reference voltage are applied to the liquid crystal capacitors Clc adjacent to each other. In particular, the liquid crystal capacitors Clc electrically connected to one of the source lines D1, D2, . . . , Dn alternately receive an opposite data voltage polarity, and the liquid crystal capacitors Clc electrically connected to one of the gate lines G1, G2, . . . , Gm alternately receive an opposite data voltage polarity. Additionally, a polarity of the data voltage applied to each liquid crystal capacitor Clc in an n-th frame is opposite to a polarity of the data voltage applied to each liquid crystal capacitor Clc in an (n−1)-th frame.

According to the dot inversion method, a polarity period of the data voltage is 2 H, because the polarity of the data voltage corresponding to each of the gate lines G1, G2, . . . , Gm is alternated, and a clock signal for driving the shift register 120 is two (CK1 and CK2 in FIG. 2). Therefore, a least common multiple is 2. Therefore, a time period between the rising edge of the sub scan signal SSS and the rising edge of the main scan signal MSS is 2 H, and the scan driver in FIG. 6 includes two stages STAGE770 and STAGE771.

Additionally, in the embodiment of FIG. 1 according to the dot inversion method, both of the starting part 111 and the ending part 112 of the multiple signal applying unit 110 includes two stages. According to the present embodiment, the sub scan signal SSS and the main scan signal MSS of the scan start signal STVP sequentially activate gate lines instead of the starting part 111 in FIGS. 1 and 2. In other words, an operation of the stages in the shift register 120 is substantially the same as that in FIGS. 1 to 6. Therefore, a detailed explanation of 1 H to 4 H time period will be omitted.

Figure 9:
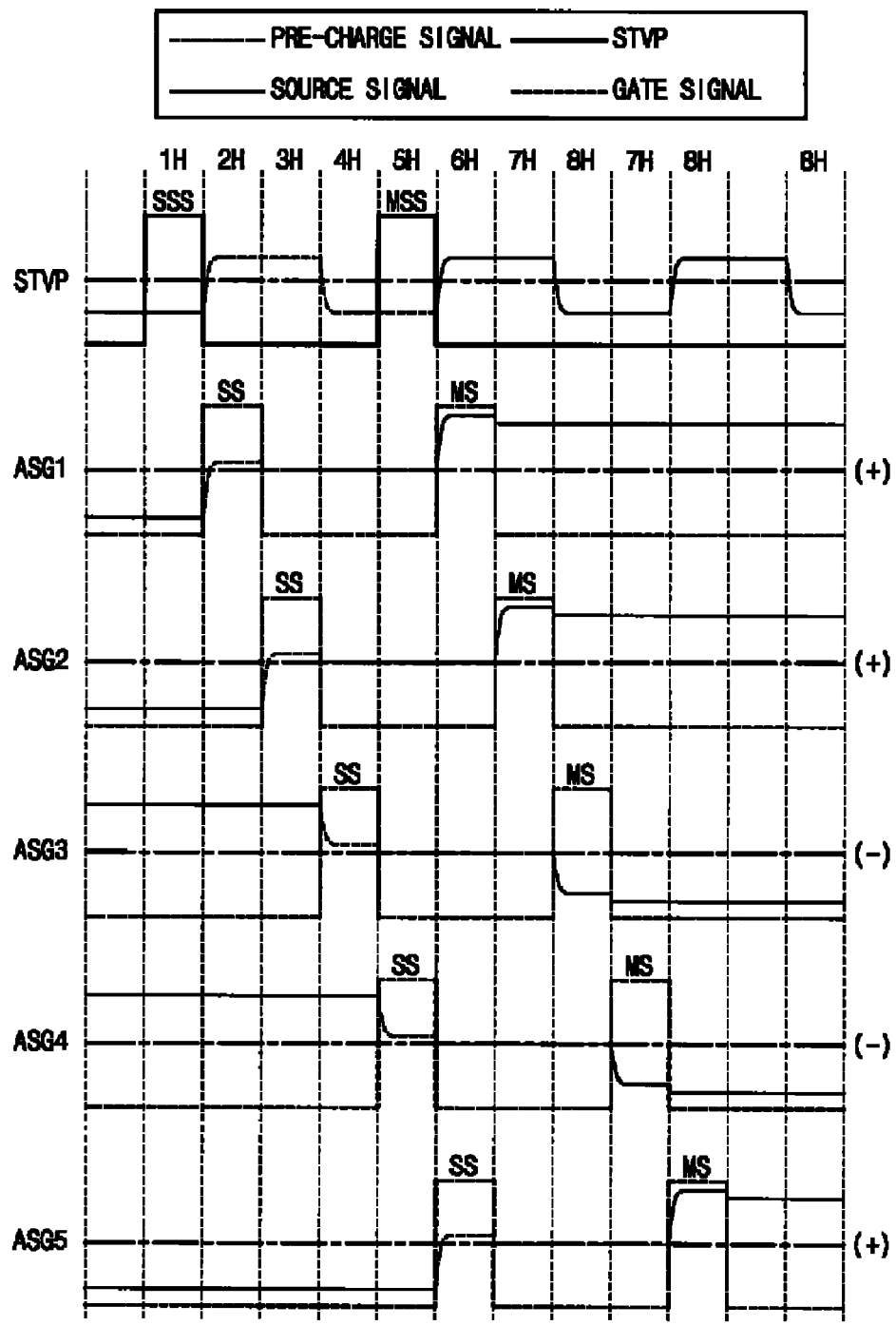
FIG. 9 is a timing diagram illustrating input and output signals of the exemplary scan driver in FIG. 6 according to a 2×1 inversion driving method.

FIG. 9 is a timing diagram illustrating input and output signals of the exemplary scan driver in FIG. 6 according to a 2×1 inversion driving method. The exemplary method of driving the exemplary display device in FIG. 6, which is described in FIG. 9, may also be employed by the exemplary display device in FIG. 1.

According to the 2×1 inversion method, data voltages having positive, positive, negative, and negative polarities with respect to a reference voltage are repeatedly applied to the liquid crystal capacitors Clc electrically connected to an i-th source line Si, and data voltages having negative, negative, positive, and positive polarities with respect to the reference voltage are repeatedly applied to liquid crystal capacitors Clc electrically connected to (i+1)-th source line Si+1. Additionally, a polarity of the data voltage applied to each liquid crystal capacitor Clc in an n-th frame is opposite to a polarity of the data voltage applied to each liquid crystal capacitor Clc in an (n−1)-th frame.

According to the 2×1 inversion method, a polarity period of the data voltage is 4 H, and a clock signal for driving the shift register is two (CK1 and CK2 in FIG. 2). Therefore, a least common multiple is 4. Thus, according to the 2×1 inversion, a time period between the rising edge of the sub scan signal SSS and the rising edge of the main scan signal MSS is 4 H, and the scan driver in FIG. 6 includes four stages STAGE770, STAGE771, STAGE772, and STAGE773.

Additionally, in the embodiment of FIG. 1 according to the 2×1 inversion driving method, both of the starting part 111 and the ending part 112 of the multiple signal applying unit 110 includes four stages.

According to the present embodiment employing the scan driver of FIG. 6, the sub scan signal SSS and the main scan signal MSS of the scan start signal STVP sequentially activate gate lines instead of the starting part 111 in FIGS. 1 and 2, and data voltages having positive, positive, negative, and negative polarities are repeatedly applied to liquid crystal capacitors Clc electrically connected to one of the source lines D1, D2, . . . , Dn. In other words, an operation of the stages in the shift register 120 is substantially the same as that in FIGS. 1 to 6. Therefore, a detailed explanation of 1 H to 4 H time period will be omitted.

Figure 10:
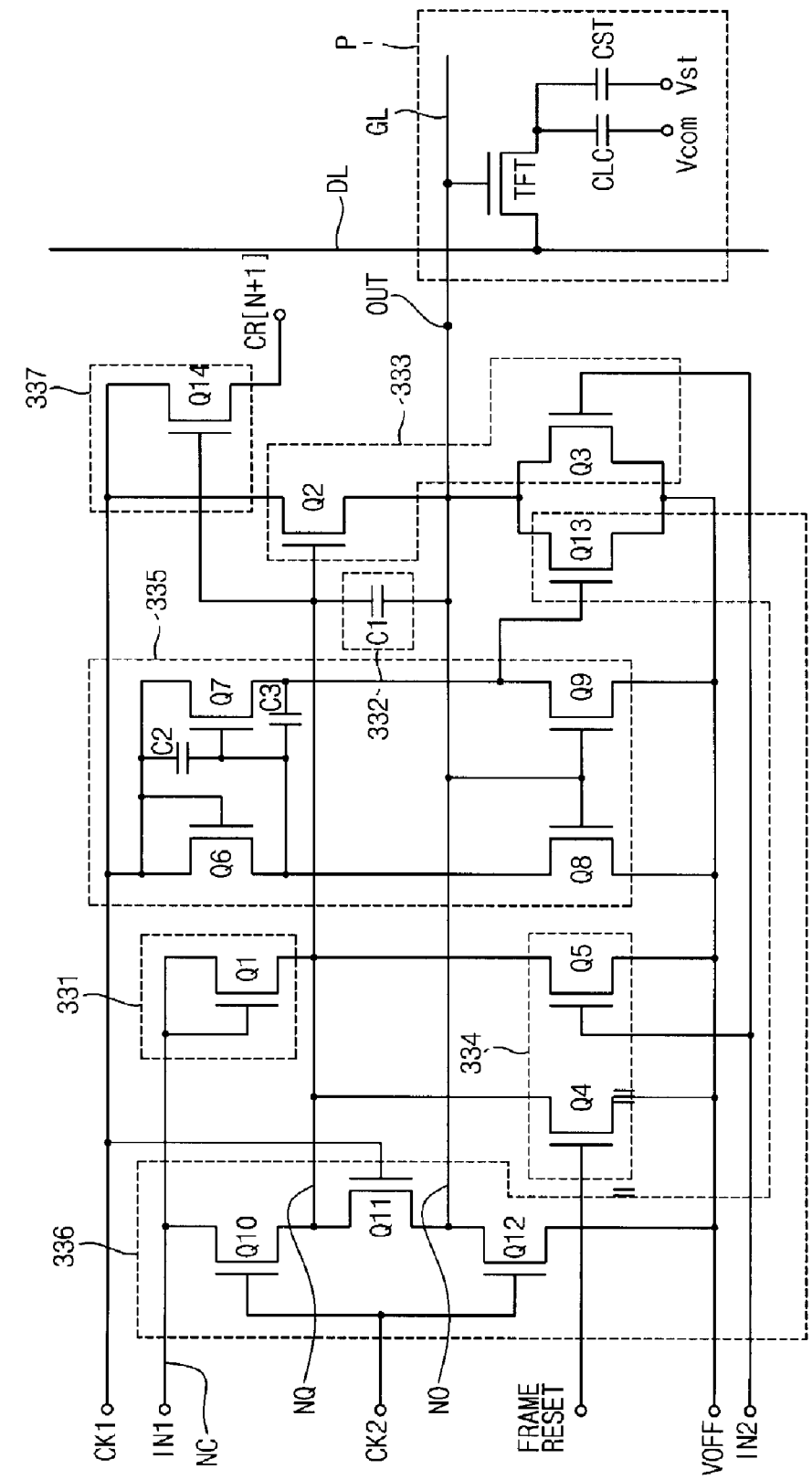
FIG. 10 is an equivalent circuit diagram illustrating an exemplary stage of an exemplary multiple signal applying unit and an exemplary shift register of the exemplary scan driver in FIGS. 1 and 6.

FIG. 10 is an equivalent circuit diagram illustrating an exemplary stage of an exemplary multiple signal applying unit and an exemplary shift register of the exemplary scan driver in FIGS. 1 and 6.

Referring to FIG. 10, a unit pixel P includes a switching element TFT such as a thin film transistor, a liquid crystal capacitor Clc, and a storage capacitor Cst. The switching element TFT includes a gate electrode that is electrically connected to a gate line GL, a source electrode that is electrically connected to a source line DL, and a drain electrode that is electrically connected to the liquid crystal capacitor Clc and the storage capacitor Cst.

Each stage 330 includes a buffering unit 331, a charging unit 332, a driving unit 333, a discharging unit 334, a first holding unit 335, a second holding unit 336, and a carry unit 337. Each stage 330 outputs a scan signal to output terminal OUT and to the switching element TFT of the pixel P based on the scan start signal STVP or a carry signal (CS) of a previous stage.

The buffering unit 331 includes a first switching element Q1. The first switching element Q1 includes a gate electrode and a drain electrode electrically connected to each other. The first switching element Q1 further includes a source electrode that is electrically connected to the charging unit 332. A first input signal IN1 is applied to the gate and drain electrodes of the first switching element Q1 of the buffering unit 331, and outputs a gate on signal Von to the charging unit 332, the driving unit 333, the discharging unit 334, the first holding unit 335, and the second holding unit 336. When the stage 330 is a first stage, the first input signal IN1 corresponds to the scan start signal STVP.

The charging unit 332 includes a capacitor C1 having a first terminal that is electrically connected to the first switching element Q1 of the buffering unit 331, and a second terminal that is electrically connected to an output terminal of the driving unit 333.

The driving unit 333 includes a second switching element Q2 and a third switching element Q3. The second switching element Q2 includes a drain electrode that is electrically connected to a clock terminal CK, a gate electrode that is electrically connected to the first terminal of the capacitor C1 of the charging unit 332 through the Q-node NQ, and a source electrode that is electrically connected to the second terminal of the capacitor C1 and the output terminal OUT. The third switching element Q3 includes a drain electrode that is electrically connected to the source electrode of the second switching element Q2 and the second terminal of the capacitor C1, and a source electrode that is electrically connected to the first source voltage VOFF. When the stage 330 is one of the odd-numbered stages STAGE1, STAGE3, ..., a first clock signal CK1 is applied to the drain electrode of the second switching element Q2. On the contrary, when the stage 330 is one of the even-numbered stages STAGE2, STAGE4, ..., a second clock signal CK2 having a phase, which is opposite to a phase of the first clock signal CK1, is applied to the drain electrode of the second switching element Q2. The second switching element Q2 pulls up a state of the output terminal OUT, and the third switching element Q3 pulls down the state of the output terminal OUT.

The discharging unit 334 includes a fourth switching element Q4 and a fifth switching element Q5. The discharging unit 334 removes electric charges of the first capacitor C1 in the charging unit 332 through the first source voltage VOFF in response to a second input signal IN2 and the frame reset signal FRAME RESET.

In particular, the fifth switching element Q5 includes a drain electrode that is electrically connected to the first terminal of the first capacitor C1, a gate electrode that receives the second input signal IN2, and a source electrode that is electrically connected to the first source voltage VOFF. The fourth switching element Q4 includes a drain electrode that is electrically connected to the first terminal of the first capacitor C1, a gate electrode that receives the frame reset signal FRAME RESET, and a source electrode that receives the first source voltage VOFF. The second input signal IN2 resets the stage 330. An output signal of a next stage is employed as the second input signal IN2.

The first holding unit 335 includes a sixth switching element Q6, a seventh switching element Q7, an eighth switching element Q8, a ninth switching element Q9, a second capacitor C2, and a third capacitor C3. The first holding unit 335 controls the second holding unit 336 to be turned on and off.

In particular, the sixth switching element Q6 includes a drain electrode and a gate electrode electrically connected to each other. The drain and gate electrodes of the sixth switching element Q6 receive the first clock signal CK1. The seventh switching element Q7 includes a drain electrode that receives the first clock signal CK1, a gate electrode that is electrically connected to the source electrode of the sixth switching element Q6, and a source electrode that is electrically connected to the second holding unit 336.

The second capacitor C2 includes a first terminal that is electrically connected to a drain electrode of the seventh switching element Q7, and a second terminal that is electrically connected to a gate electrode of the seventh switching element Q7. The third capacitor C3 includes a first terminal that is electrically connected to the gate electrode of the seventh switching element Q7, and a second terminal that is electrically connected to the source electrode of the seventh switching element Q7. The eighth switching element Q8 includes a drain electrode that is electrically connected to the source electrode of the sixth switching element Q6 and the gate electrode of the seventh switching element Q7, a gate electrode that is electrically connected to the output terminal OUT, and a source electrode that receives the first source voltage VOFF. The ninth switching element Q9 includes a drain electrode that is electrically connected to the source electrode of the seventh switching element Q7 and the second holding unit 336, a gate electrode that is electrically connected to the output terminal OUT, and a source electrode that is electrically connected to the first source voltage VOFF.

The second holding unit 336 includes a tenth switching element Q10, an eleventh switching element Q11, a twelfth switching element Q12, and a thirteenth switching element Q13. The second holding unit 336 prevents an output node NO from floating. In other words, the second holding unit 336 maintains an off-state to hold the output node NO when the output terminal OUT is in a high level.

In particular, the thirteenth switching element Q13 includes a drain electrode that is electrically connected to the output terminal OUT, a gate electrode that is electrically connected to the first holding unit 335, and a source electrode that receives the first source voltage VOFF. The tenth switching element Q10 includes a drain electrode that receives the first input signal IN1, a gate electrode that receives the second clock signal CK2, and a source electrode that is electrically connected to the first terminal of the first capacitor C1 of the charging unit 332. The eleventh switching element Q11 includes a drain electrode that is electrically connected to the source electrode of the tenth switching element Q10 and the first terminal of the first capacitor C1, a gate electrode that receives the first clock signal CK1, and a source electrode that is electrically connected to the output terminal OUT. The twelfth switching element Q12 includes a drain electrode that is electrically connected to the output terminal OUT, a gate electrode that is electrically connected to the gate electrode of the tenth switching element Q10 to receive the second clock signal CK2, and a source electrode that is electrically connected to the first source voltage VOFF. The first clock signal CK1 has an opposite phase to that of the second clock signal CK2.

The seventh switching element Q7 and the ninth switching element Q9 of the first holding unit 335 pull down the gate electrode of the thirteenth switching element Q13 of the second holding unit 336, only when the output terminal OUT is in a high level.

When output signal of the stage 330 is low, a control signal that is synchronized with the first clock signal CK1 is applied to the gate electrode of the thirteenth switching element Q13 through the seventh switching element Q7. A gate voltage of the seventh switching element Q7 is lower than a high level of the first clock signal CK1 by a threshold voltage except when the output terminal OUT is in a high level. Therefore, the control signal synchronized with the first clock signal CK1 is applied to the gate electrode of the thirteenth switching element Q13 except when the output terminal OUT is in a high level.

When the second clock signal CK2 is in a high level, the output terminal OUT of the shift register 120 is in a low level, so that the twelfth switching element Q12 holds the output terminal OUT to be the first source voltage VOFF through the second clock signal CK2.

The carry unit 337 includes a fourteenth switching element Q14. The carry unit 337 receives the first clock signal CK1, and the fourteenth switching element Q14 of the carry unit 337 is turned on to apply the first clock signal CK1 to a carry node NC of a next stage when the Q-node NQ is activated. As a result, even when the voltage level of the output terminal OUT is changed, the carry unit 337 outputs the first clock signal CK1 as a carry signal.

The stage 330 of the shift register 120 shown in FIG. 10 is only an example. It would be within the scope of these embodiments to employ various stages of a shift register as the stages of the present invention.

Figure 11:
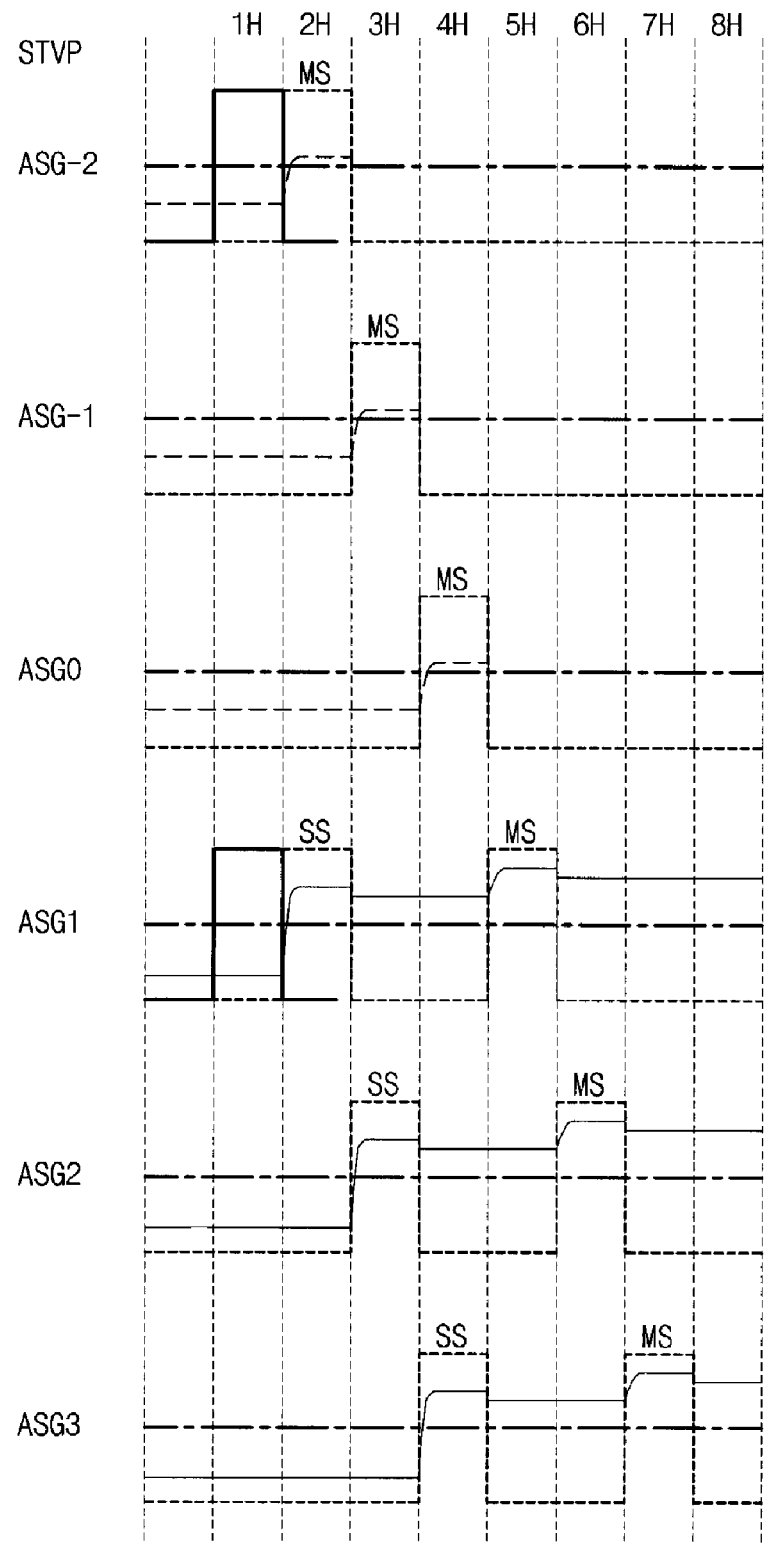
FIG. 11 is a timing diagram illustrating input and output signals of the exemplary scan driver in an exemplary display device employing the exemplary stages in FIG. 10.

FIG. 11 is a timing diagram illustrating input and output signals of the exemplary scan driver in an exemplary display device employing the exemplary stage in FIG. 10.

When the display device 100 in FIG. 1 employs the stage in FIG. 10, each of the starting part 111 and the ending part 112 of the multiple signal applying unit 110 includes three stages. When the display device 700 in FIG. 6 employs the stage in FIG. 10, the multiple signal applying unit 710 includes three stages, and a time interval between a rising edge of the sub scan signal SSS and a rising edge of the main scan signal MSS is 3 H.

Within the stage in FIG. 10, the first source voltage VOFF and the scan start signal STVP, or the first source voltage VOFF and the carry signal CS may collapse. Therefore, preferably, the time period between the rising edge of the sub scan signal SSS and the rising edge of the main scan signal MSS is more spaced apart from each other by 1 H than that in FIG. 4.

In the above-described embodiments, the term "least common multiple" may be replaced by "common multiple." However, when a time interval between the rising edge of the sub scan signal SSS and the rising edge of the main scan signal MSS increases, a number of activated gate lines undesirably increases.

Figure 12A:
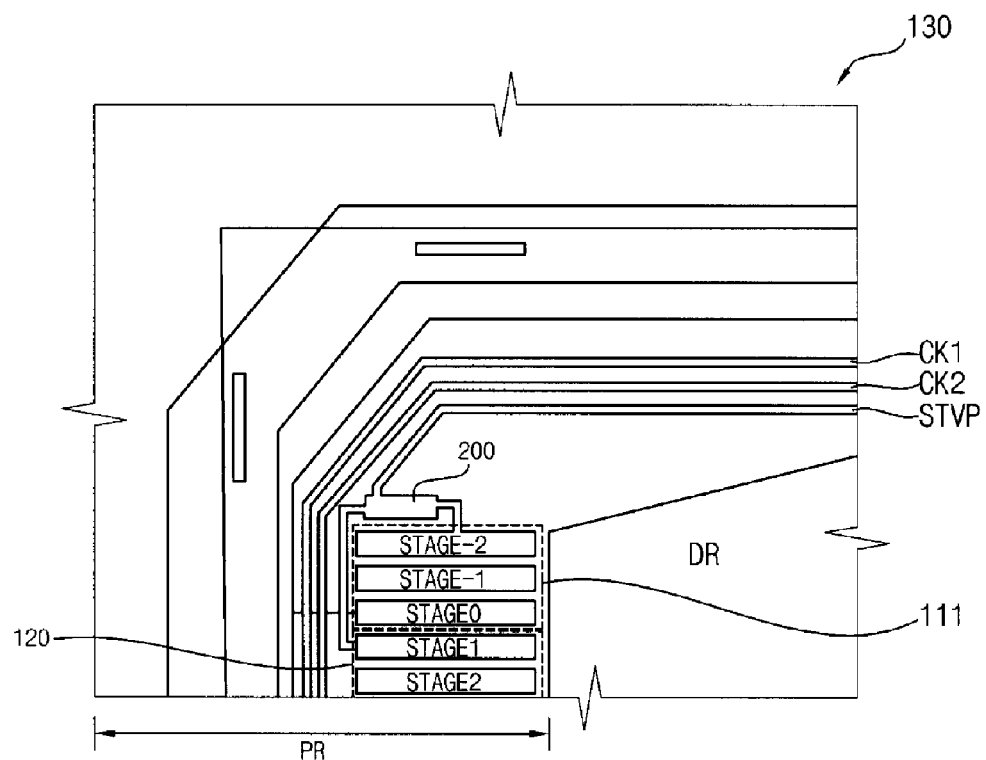
FIGS. 12A and 12B are layouts illustrating an exemplary multiple signal applying unit and the exemplary shift register in FIG. 10.
Figure 12B:
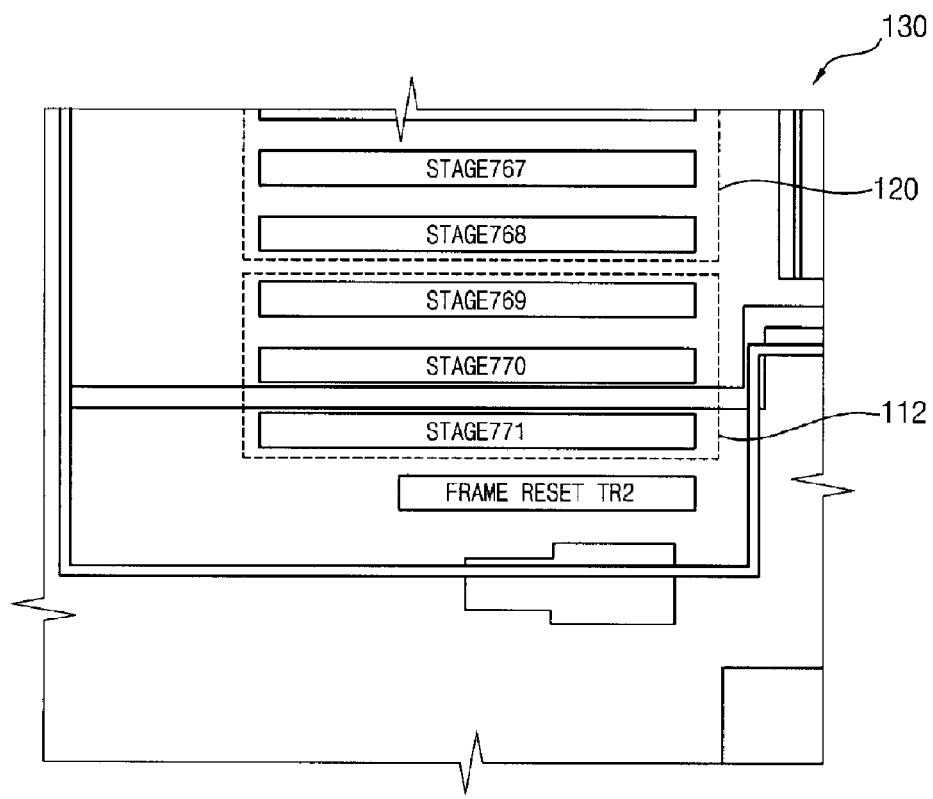

FIGS. 12A and 12B are layouts illustrating an exemplary multiple signal applying unit and the exemplary shift register in FIG. 10.

Referring to FIGS. 1, 3, 12A, and 12B, the shift register 120 may be integrally formed with the LCD panel 130. In particular, the shift register 120 may be formed on the LCD panel 130.

When the shift register 120 is formed on the LCD panel 130, the multiple signal applying unit 110 is also formed on the LCD panel 130.

The plurality of gate lines G1, G2, . . . , Gm extended along a first direction, the plurality of source lines D1, D2, . . . , Dn extended along a second direction that is substantially perpendicular to the first direction, the switching element TFT, the liquid crystal capacitor Clc and the storage capacitor are formed on a display region DR of the LCD panel 130. The shift register 120 and the multiple signal applying unit 110 are formed in a peripheral region PR of the LCD panel 130 that is adjacent to the display region DR. As shown in FIG. 12A, the starting part 111 of the multiple signal applying unit 110 is adjacent to the first stage STAGE1 of the shift register 120. As shown in FIG. 12B, the ending part 112 of the multiple signal applying unit 110 is adjacent to the last stage STAGE768 of the shift register 120. Both the starting part 111 and the ending part 112 in FIGS. 12A and 12B include, for example, three stages in order to separate the rising edge of the main scan signal MS from the rising edge of the sub scan signal SS by 3 H time period. Additionally, the diode 200 may be formed through an amorphous silicon ("a-Si") transistor having the gate and drain electrodes electrically connected to each other.

Figure 13:
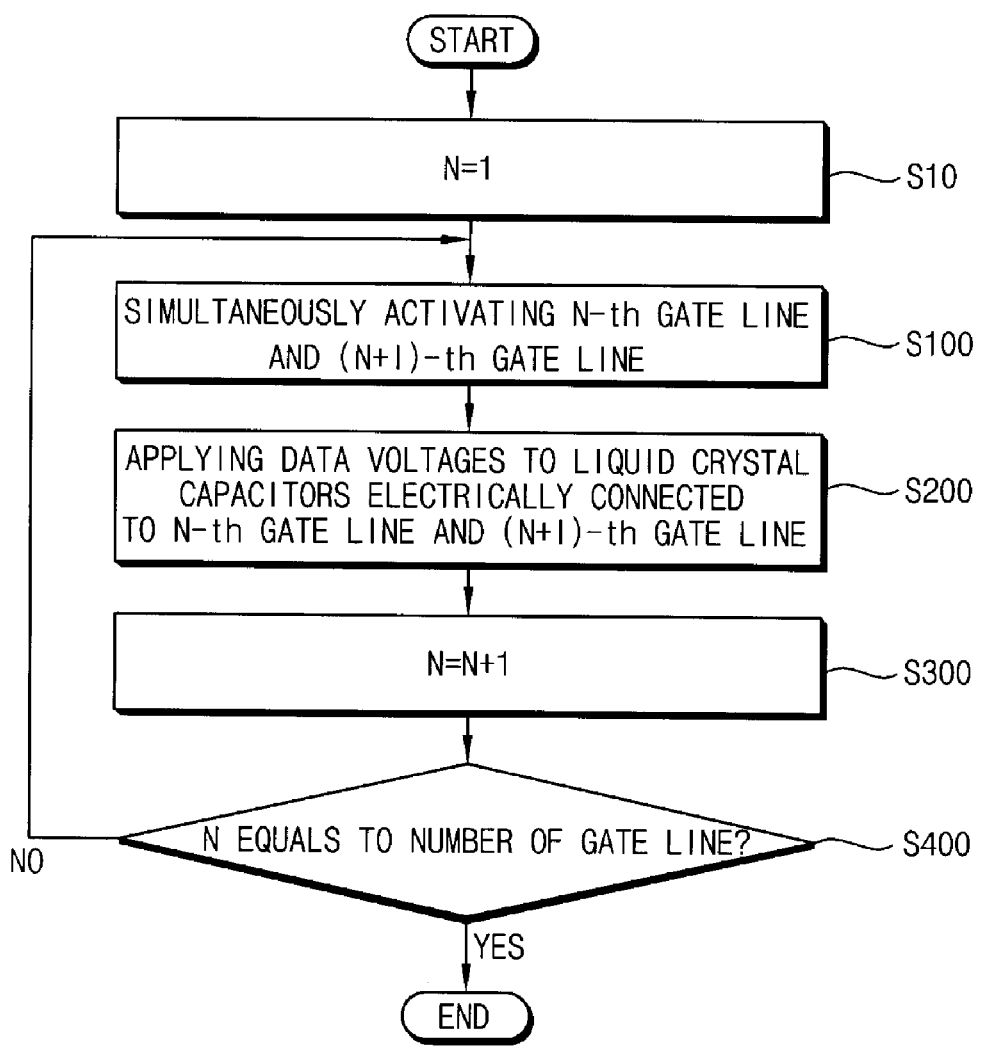
FIG. 13 is a flow chart illustrating an exemplary method of driving an exemplary display device according to an exemplary embodiment of the present invention.

FIG. 13 is a flow chart illustrating an exemplary method of driving an exemplary display device according to an exemplary embodiment of the present invention.

According to a method of driving a display device, the method begins with N=1. Then, an N-th gate line and an (N+I)-th gate line are simultaneously activated as shown by S100, and data voltages are applied to liquid crystal capacitors Clc that are electrically connected to the N-th gate line and the (N+I)-th gate line as shown by S200, wherein 'I' represents a least common multiple of a polarity period of a data voltage (with respect to a reference voltage) applied to each of the gate lines G1, G2, . . . Gm along a source line, and a clock number for driving the shift register.

The above portions of the method shown by S100 and S200 are repeated, while increasing N by one as shown by S300, until N reaches the last gate line. When N+I is over the last gate line, no gate line corresponds to the N+I, so that (N+I)-th gate line is not activated.

The data voltage corresponds to the liquid crystal capacitor Clc electrically connected to the N-th gate line. Therefore, the data voltage corresponding to the N-th gate line is also applied to the liquid crystal capacitors Clc electrically connected to the (N+I)-th gate line, in order to pre-charge the liquid crystal capacitors Clc electrically connected to the (N+I)-th gate line. Therefore, the liquid crystal capacitors Clc may be fully charged. Furthermore, even though the liquid crystal capacitors Clc electrically connected to the (N+I)-th gate line receive the data voltage corresponding to the liquid crystal capacitor Clc electrically connected to the N-th gate line, the time period is too short for a user to perceive an image.

As described above, according to the present invention, the scan lines (the gate lines) receive the scan signal twice, so that the liquid crystal capacitors Clc electrically connected to the gate lines receive the data voltage twice. Therefore, even though the time for charging the liquid crystal capacitors Clc may be reduced, the liquid crystal capacitors Clc may be fully charged to enhance display quality.

Furthermore, the LCD device may employ a dot inversion method, a column inversion method, a 2×1 inversion method, etc. as a driving method thereof in order to reduce a gradual failure of the liquid crystal. According to the dot inversion method, the column inversion method, the 2×1 inversion method, etc., a data voltage having an opposite polarity with respect to a reference voltage is applied to the liquid crystal capacitors Clc. Therefore, when the liquid crystal capacitors Clc are pre-charged, and then mainly charged, the liquid crystal capacitors Clc are ready for an inversion during being pre-charged. Therefore, according to the LCD device employing the dot inversion method, the column inversion method, the 2×1 inversion method, etc., the effectiveness of the present invention may be more enhanced.

Having described the exemplary embodiments of the present invention and its advantages, it is noted that various changes, substitutions and alterations can be made herein without departing from the spirit and scope of the invention as defined by appended claims.

What is claimed is:

1. A scan driver driving a display device having a plurality of gate lines transferring scan signals, and a plurality of source lines transferring data signals, the scan driver comprising:

a shift register including a plurality of cascade-connected stages having a first stage connected to a first gate line, each stage having an output terminal electrically connected to a respective one of the plurality of gate lines; and a multiple signal applying unit applying a sub scan signal and a main scan signal, the sub scan signal and the main scan signal sequentially activating each of the plurality of gate lines, wherein the multiple signal applying unit comprises a starting part and an ending part, each of the starting part and the ending part includes 'I' number of stages, a last stage of the starting part is cascade-connected to the first stage of the shift register, and a last stage of the shift register is cascade-connected to a first stage of the ending part, wherein the 'I' number of stages of the starting part and the 'I' number of stages of the ending part are separated from the gate lines so that none of the 'I' number of stages of the starting part and the 'I' number of stages of the ending part is connected to the gate lines, and wherein an output of a stage of the 'I' number of stages of the ending part is inputted to a successive stage of the 'I' number of stages of the ending part.

2. The scan driver of claim 1, wherein a scan start signal for driving the shift register is simultaneously applied to both of a first stage of the starting part and the first stage of the shift register.

3. The scan driver of claim 2, further comprising a diode formed on a line through which the scan start signal is applied to the first stage of the shift register, the diode preventing a carry signal outputted from the last stage of the starting part from being applied to the first stage of the starting part.

4. The scan driver of claim 3, wherein the diode is an amorphous silicon thin-film transistor having a gate electrode and a drain electrode electrically connected to each other.

5. The scan driver of claim 1, wherein a starting part of the multiple signal applying unit is adjacent to a first stage of the shift register, and an ending part of the multiple signal applying unit is adjacent to a last stage of the shift register.

6. A display device comprising:
   a liquid crystal display panel including a plurality of gate lines transferring scan signals, and a plurality of source lines transferring data signals; and
   a scan driver driving the liquid crystal display panel, the scan driver including:
   a shift register including a plurality of cascade-connected stages having a first stage connected to a first gate line, each stage having an output terminal electrically connected to a respective of the plurality of gate lines; and
   a multiple signal applying unit applying a sub scan signal and a main scan signal, the sub scan signal and the main scan signal sequentially activating each of the plurality of gate lines, wherein the multiple signal applying unit comprises a starting part and an ending part, each of the starting part and the ending part includes 'I' number of stages, a last stage of the starting part is cascade-connected to the first stage of the shift register, and a last stage of the shift register is cascade-connected to a first stage of the ending part,
   wherein the 'I' number of stages of the starting part and the 'I' number of stages of the ending part are separated from the gate lines so that none of the 'I' number of stages of the starting part and the 'I' number of stages of the ending part is connected to the gate lines, and
   wherein an output of a stage of the 'I' number of stages of the ending part is inputted to a successive stage of the 'I' number of stages of the ending part.

7. The display device of claim 6, wherein a scan start signal for driving the shift register is simultaneously applied to both of a first stage of the starting part and the first stage of the shift register.

8. The display device of claim 7, further comprising a diode formed on a line through which the scan start signal is applied to the first stage of the shift register, the diode preventing a carry signal outputted from the last stage of the starting part from being applied to the first stage of the starting part.

9. The display device of claim 6, wherein a starting part of the multiple signal applying unit is adjacent to a first stage of the shift register, and an ending part of the multiple signal applying unit is adjacent to a last stage of the shift register.

* * * * *